(12) United States Patent
Kawasumi et al.

(10) Patent No.: US 7,023,283 B2
(45) Date of Patent: Apr. 4, 2006

(54) WIDE LOCK RANGE PHASE LOCKED LOOP AND METHOD OF OPERATION

(75) Inventors: Yoko Kawasumi, Kanagawa (JP);
Akira Kuwano, Kanagawa (JP);
Yoshitaka Murata, Kanagawa (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 13 days.

(21) Appl. No.: 10/787,622

(22) Filed: Feb. 25, 2004

(65) Prior Publication Data

US 2004/0164811 A1 Aug. 26, 2004

(30) Foreign Application Priority Data

Feb. 25, 2003 (JP) .............................. 2003-047011

(51) Int. Cl.
*H03L 7/00* (2006.01)

(52) U.S. Cl. .............................. 331/2; 331/17; 331/25; 331/34; 331/46; 331/177 V; 331/179

(58) Field of Classification Search .................. 331/17, 331/25, 34, 2, 46, 177 V, 179
See application file for complete search history.

(56) References Cited

U.S. PATENT DOCUMENTS 6,838,947 B1 *  1/2005  Gomez ......................... 331/17

FOREIGN PATENT DOCUMENTS

| EP | 0 825 714 | 2/1998 |
|---|---|---|
| EP | 1 005 167 | 5/2000 |
| EP | 1 189 351 | 3/2002 |
| JP | 4-186926 | 7/1992 |
| JP | 10-200406 | 7/1998 |
| JP | 2001-144613 | 5/2001 |
| JP | 2001-251186 | 9/2001 |
| JP | 2001-339301 | 12/2001 |
| JP | 2003-051745 | 2/2003 |

OTHER PUBLICATIONS

European Search Report dated Mar. 14, 2005.
European Search Report dated May 18, 2004.

* cited by examiner

*Primary Examiner*—Arnold Kinkead

(57) ABSTRACT

In a phase locked loop type frequency synthesizer including a phase/frequency comparator for receiving an input signal, a charge pump circuit, a loop filter for generating a control voltage, a voltage control oscillator block including a plurality of voltage controlled oscillators controlled by the control voltage, and a frequency divider formed by a fixed frequency divider and a programmable frequency divider, a selecting circuit selects and activates only one of the voltage controlled oscillators, and counts a number of output pulses of the first frequency divider within a predetermined number of output pulses of the input signal while applying a bias voltage to the loop filter. Thus, the one of the voltage controlled oscillators being selected so that the number of the output pulses of the first frequency divider is brought close to an optimum value.

10 Claims, 9 Drawing Sheets

WIDE LOCK RANGE PHASE LOCKED LOOP AND METHOD OF OPERATION

BACKGROUND OF THE INVENTION

1. Field of the Invention

The present invention relates to a wide lock range phase locked loop (PLL) type frequency synthesizer including a plurality of voltage controlled oscillators and its method for selecting an oscillation frequency.

2. Description of the Related Art

Generally, in a mobile telephone apparatus, a wide lock range PLL type frequency synthesizer having a plurality of voltage controlled oscillators is mounted as a local oscillator to cope with different frequencies.

In a prior art wide lock range PLL type frequency synthesizer (see: JP-A-10-200406) including a PLL circuit having a phase/frequency comparator, a charge pump circuit, a loop filter, a voltage controlled oscillator block formed by a plurality of voltage controlled oscillators and a plurality of switches connected to the voltage controlled oscillators, and a 1/N frequency divider where N is a positive integer, an unlock control circuit is provided. The unlock control circuit has an unlocked state detecting circuit, an up/down counter, and a selector for selecting one of the switches in accordance with the output signals of the up/down counter. In this case, the up/down counter is connected to the phase/frequency comparator. That is, in an unlocked state, the unlocked state detecting circuit passes the output signals of the phase/frequency comparator to the up/down counter. As a result, when the phase/frequency comparator generates a leading signal, the up/down counter is counted up. Therefore, when the value of the up/down counter reaches its maximum value, the up/down counter generates an overflow carry signal, so that the selector selects another switch. Contrary to this, when the phase/frequency comparator generates a lagging signal, the up/down counter is counted down. Therefore, when the value of the up/down counter reaches its minimum value, the up/down counter generates an underflow carry signal, so that the selector selects another switch. Thus, as the oscillation frequency of the voltage control oscillator block fluctuates due to a temperature fluctuation or power supply voltage fluctuation, the up/down counter and the selector and are operated to quickly move a phase unlocked state to a phase locked loop stage. This will be explained later in detail.

In the above-described prior art PLL type frequency synthesizer, however, since the up/down counter is operated by the output signals of the phase/frequency comparator, when the precision of the phase/frequency comparator is enhanced, the precision of the up/down counter also has to be enhanced. As a result, the switching from a phase unlocked state to a phase locked state is delayed which increases the lockup time.

Also, in the above-described prior art PLL type frequency synthesizer, since all the voltage controlled oscillators are always operated, the power consumption would be increased.

SUMMARY OF THE INVENTION

It is an object of the present invention to provide a wide lock range PLL type frequency synthesizer capable of enhancing the precision of a phase/frequency comparator without decreasing the lockup time.

Another object is to provide a wide lock range PLL type frequency synthesizer capable of suppressing power consumption.

A further object is to provide a method for selecting an oscillation frequency in a wide lock range PLL type frequency synthesizer.

According to the present invention, in a phase locked loop type frequency synthesizer including a phase/frequency comparator for receiving an input signal, a charge pump circuit, a loop filter for generating a control voltage, a voltage control oscillator block including a plurality of voltage controlled oscillators controlled by the control voltage, and a frequency divider formed by a fixed frequency divider and a programmable frequency divider, a selecting circuit selects and actuates only one of the voltage controlled oscillators, and counts a number of output pulses of the first frequency divider within a predetermined number of output pulses of the input signal while applying a bias voltage to the loop filter. Thus, one of the voltage controlled oscillators is selected so that the number of the output pulses of the first frequency divide is brought close to an optimum value.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art wide lock range PLL type frequency synthesizer will be explained with reference to FIG. 1 (see: JP-A-10-200406).

Figure 1:
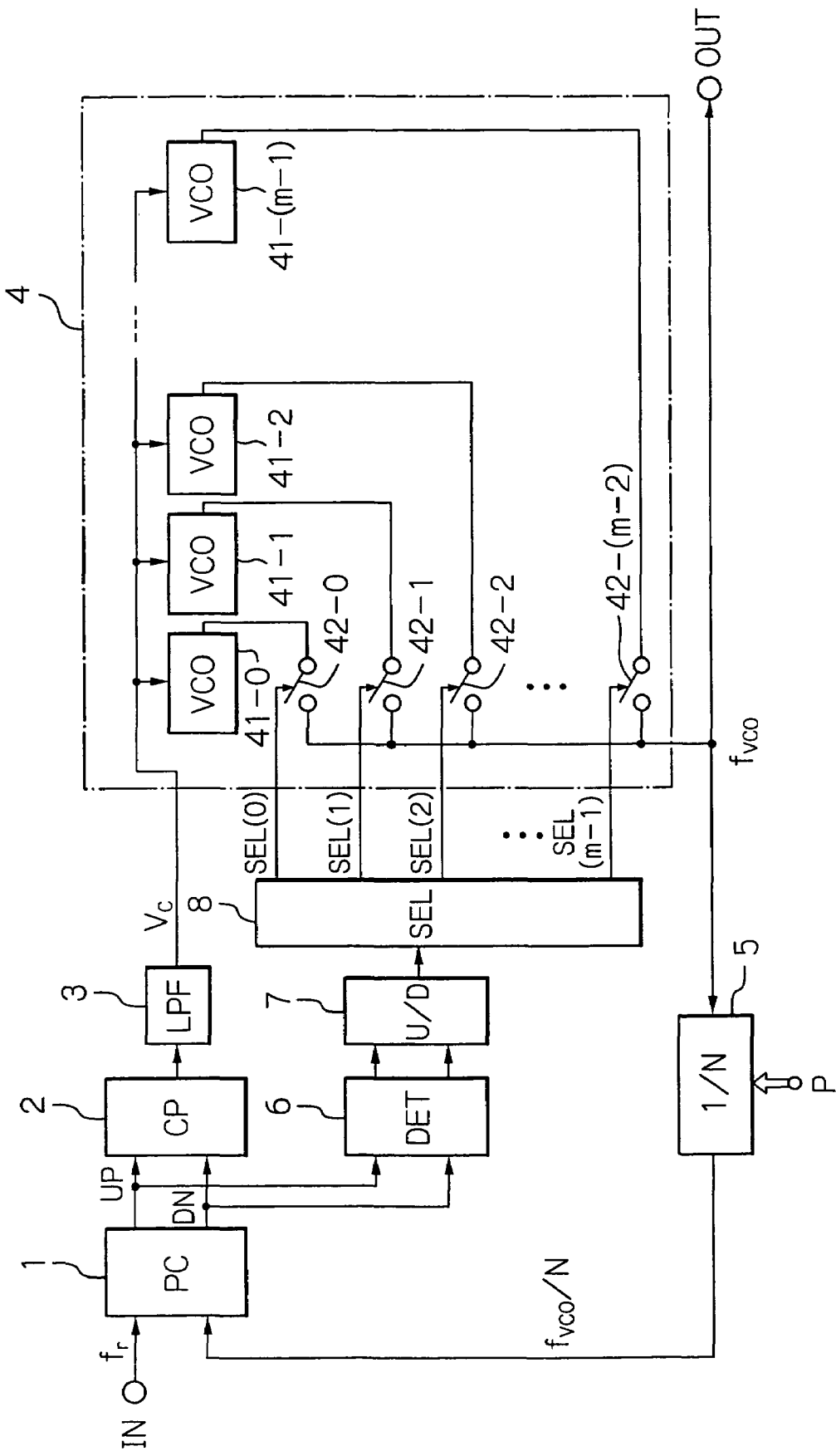
FIG. 1 is a block circuit diagram illustrating a prior art wide lock range PLL type frequency synthesizer.

In FIG. 1, the frequency synthesizer receives an input signal IN having a frequency $f_r$ to generate an output signal OUT having a frequency of $N \cdot f_r$ where N is a variable positive integer supplied from a programmable terminal P.

A phased-lock loop circuit is constructed by a phase/frequency comparator 1, a charge pump circuit 2, a loop filter 3, a voltage controlled oscillator block 4 and a 1/N frequency divider 5.

The phase/frequency comparator 1 compares the phase of the input signal IN with that of an output signal of the 1/N frequency divider 5 to generate a leading signal UP and a lagging signal DN. As a result, the charge pump circuit 2 charges the loop filter 3 in accordance with the leading signal UP and discharges the loop filter 3 in accordance with the lagging signal DN, so that the loop filter 3 generates a control voltage $V_C$. The control voltage $V_C$ is supplied to the voltage controlled oscillator block 4, thus controlling the oscillation frequency $f_{vco}$ of the voltage controlled oscillator block 4, i.e., the frequency of the output signal OUT. This output signal OUT is also supplied via the 1/N frequency divider 5 to the phase/frequency comparator 1. Therefore, in a phase locked state, the frequency $f_{vco}/N$ of the 1/N frequency divider 5 is brought close to the frequency $f_r$ of the input signal IN, i.e., $$f_r \approx f_{vco}/N$$

$$\therefore f_{vco} \approx N \cdot f_r$$

The voltage controlled oscillator block 4 is constructed by a plurality of voltage controlled oscillators 41-0, 41-1, 41-2, ..., 41-(m−1) where m is a positive integer larger than 1, and switches 42-0, 42-1, 42-2, ..., 42-(m−1). In this case, the oscillation frequency characteristics of the voltage controlled oscillators 41-0, 41-1, 41-2, ..., 41-(m−1) dependent upon the control voltage $V_C$ are different from each other, thus realizing a wide lock range. Also, the selectors 42-0, 42-1, 42-2, ..., 42-(m−1) select output signals of the voltage controlled oscillators 41-0, 41-1, 41-2, ..., 41-(m−1), respectively, In this case, only one of the switches 42-0, 42-1, 42-2, ..., 42-(m−1) is turned ON while the other switches are turned OFF. Thus, different oscillation frequencies can be realized by selecting the switches 42-0, 42-1, 42-2, ..., 42-(m−1).

Also, an unlock control circuit having an unlocked state detecting circuit 6, an up/down counter 7 and a selector 8 is provided. The selector 8 generates one selection signal SEL(0), SEL(1), SEL(2), ..., SEL(m−1) for selecting the switches 42-0, 42-1, 42-3, ..., or 42-(m−1). That is, in a phase locked state, one of the switches 42-0, 42-1, 42-2, ..., 42-(m−1) is selected by the selector 8 and is fixed. On the other hand, in a phase unlocked state, the unlocked state detecting circuit 6 detects such a phase unlocked state to pass the output signals of the phase/frequency comparator 1 to the up/down counter 7.

The unlocked state detecting circuit 6 operates to change the state of the selector 8 using the output signals of the phase/frequency comparator 1. In more detail, when the phase/frequency comparator 1 generates a leading signal UP, the up/down counter 7 is counted up. As a result, when the value of the up/down counter 7 reaches its maximum value, the up/down counter 7 generates an overflow carry signal, so that the selector 8 selects the switch 42-(i+1) provided that the switch 42-i is currently selected. Contrary to this, when the phase/frequency comparator 1 generates a lagging signal DN, the up/down counter 7 is counted down. As a result, when the value of the up/down counter 7 reaches its minimum value, the up/down counter 7 generates an underflow carry signal, so that the selector 8 selects the switch 42-(i−1) provided that the switch 42-i is currently selected.

Note that the operation speed of the selector 8 is generally higher than the operation speed of the loop filter 3, so that the phase unlocked state can quickly return to a phase locked state. Therefore, as the oscillation frequency of the voltage control oscillator block 4 fluctuates due to the temperature fluctuation or the power supply voltage fluctuation, the unlocked state detecting circuit 6, the up/down counter 7 and the selector 8 are operated to quickly move a phase unlocked state to a phase locked state.

In the PLL type frequency synthesizer of FIG. 1, however, since the up/down counter 7 is operated by the output signals of the phase/frequency comparator 1, when the precision of the phase/frequency comparator 1 is enhanced, the precision of the up/down counter 7 also has to be enhanced. As a result, the switching from a phase unlocked state to a phase locked state is delayed which increases the lockup time.

Also, since all of the voltage controlled oscillators 41-0, 41-1, 41-2, ..., 41-(m−1) are always operated, the power consumption is increased.

Figure 2:
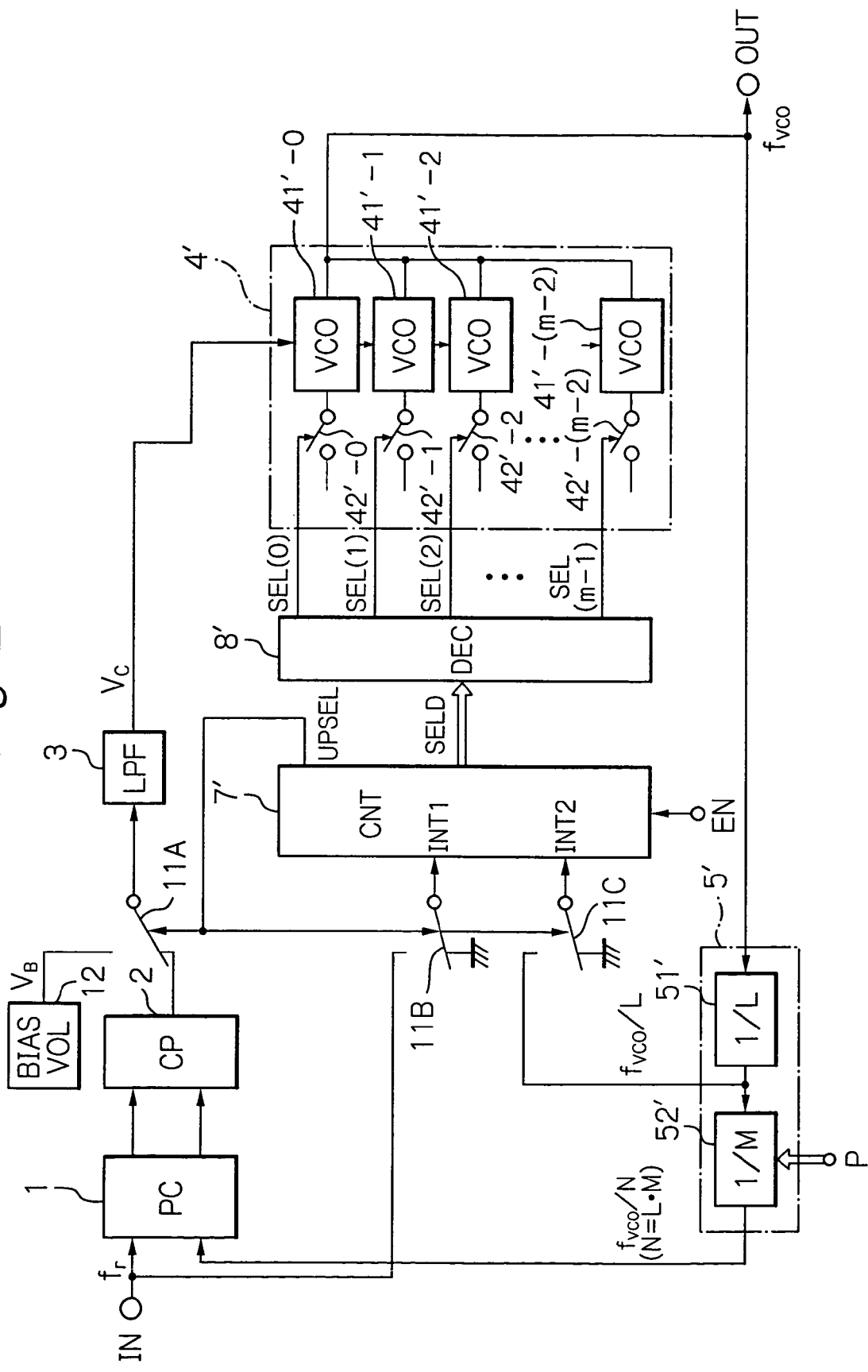
FIG. 2 is a block circuit diagram illustrating an embodiment of the wide lock range PLL type frequency synthesizer according to the present invention.

In FIG. 2, which illustrates an embodiment of the wide lock range PLL type frequency synthesizer according to the present invention, the voltage controlled oscillator block 4 and the 1/V frequency divider 5 of FIG. 1 are modified to a voltage controlled oscillator block 4' and 1/N frequency divider 5', respectively. Also, the unlocked state detecting circuit 6 of FIG. 1 is deleted. Further, the up/down counter 7 and the selector 8 of FIG. 1 are replaced by a control circuit 7' and a decoder 8', respectively. Further, switches 11A, 11B and 11C and a bias voltage source 12 are added to the elements of FIG. 1.

Figure 3:
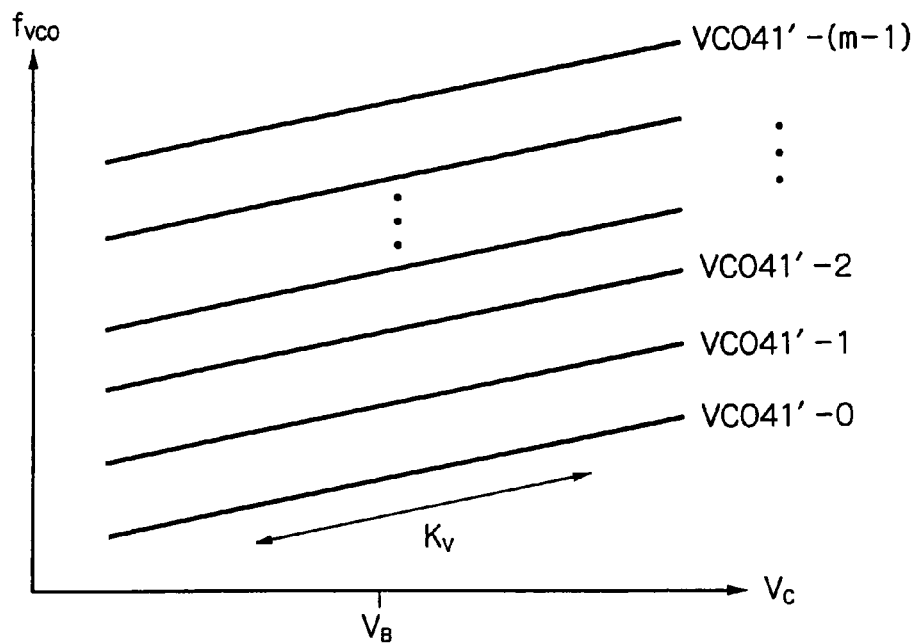
FIG. 3 is a graph showing the oscillation frequency characteristics of the voltage controlled oscillators of FIG. 2.

The voltage control oscillator block 4' is constructed by a plurality of voltage controlled oscillators 41'-0, 41'-1, 41'-2, ..., 41'-(m−1) and switches 42'-0, 42'-1, 42'-2, ..., 42'-(m−1). In this case, the voltage controlled oscillators 41'-0, 41'-1, 41'-2, ..., 41'-(m−1) have similar oscillation frequency characteristics to those of the voltage controlled oscillators 41-0, 41-1, 41-2, ..., 41-(m−1) as shown in FIG. 3. However, the switches 42'-0, 42'-1, 42'-2, ..., 42'-(m−1) do not select output signals of the voltage controlled oscillators 41'-0, 41'-1, 41'-2, ..., 41'-(m−1), but activate the voltage controlled oscillators 41'-0, 41'-1, 41'-2, ..., 41'-(m−1), respectively.

Figure 4B:
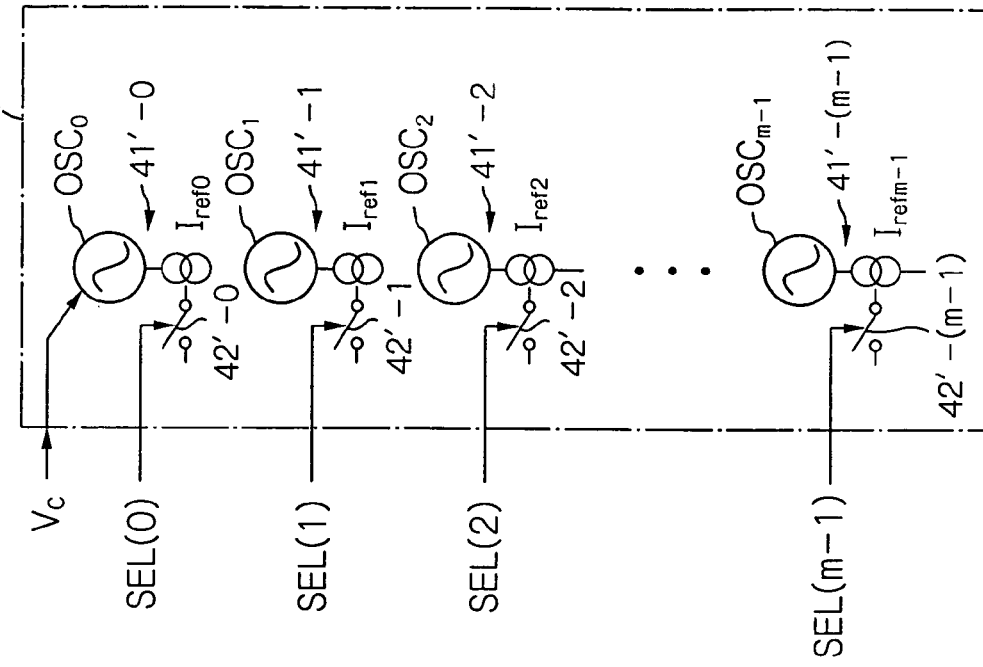
FIGS. 4A and 4B are detailed circuit diagrams illustrating examples of the voltage controlled oscillator block of FIG. 2.
Figure 4A:
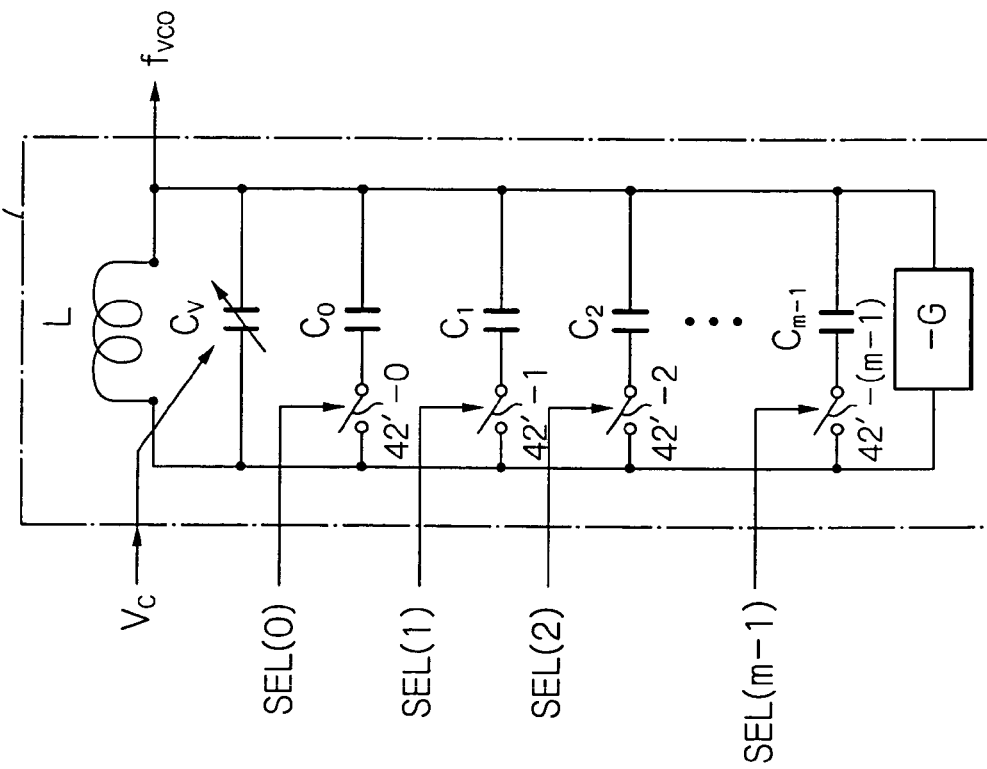

For example, as illustrated in FIG. 4A which illustrates a first example of the voltage controlled oscillator block 4' of FIG. 2, the voltage controlled oscillator block 4' is constructed by a fixed inductor L, a variable capacitor $C_V$ controlled by the control voltage $V_C$, fixed capacitors $C_0$, $C_1$, $C_2$, ..., $C_{m-1}$, and a fixed resistor (−G). The voltage controlled oscillator 41'-0 is formed by the fixed inductor L, the variable capacitor $C_V$, the fixed capacitor $C_0$ and the resistor (−G). The voltage controlled oscillator 41'-1 is formed by the fixed inductor L, the variable capacitor $C_V$, the fixed capacitor $C_1$ and the resistor (−G). The voltage controlled oscillator 41'-2 is formed by the fixed inductor L, the variable capacitor $C_V$, the fixed capacitor $C_2$ and the resistor (−G). Similarly, the voltage controlled oscillator 41'-(m−1) is formed by the fixed inductor L, the variable capacitor $C_V$, the fixed capacitor $C_{m-1}$ and the resistor (−G).

On the other hand, as illustrated in FIG. 4B, which illustrates a second example of the voltage controlled oscillator block 4' of FIG. 2, the voltage controlled oscillator block 4' is constructed by oscillator units $OSC_0$, $OSC_1$, $OSC_2$, ..., $OSC_m$, controlled by the control voltage $V_C$ and reference current sources $I_{ref0}$, $I_{ref1}$, $I_{ref2}$, ..., $I_{refm-1}$ connected to the oscillator units $OSC_0$, $OSC_1$, $OSC_2$, ..., $OSC_{m-1}$, respectively. That is, the reference current sources $I_{ref0}$, $I_{ref1}$, $I_{ref2}$, ..., $I_{refm-1}$ are turned ON and OFF by the switches 42'-0, 42'-1, 42'-2, ..., 42'-(m−1), respectively.

The 1/N frequency divider 5' is constructed by a prescaler, i.e., an 1/L frequency divider 51' where L is a fixed positive integer larger than 1 and a 1/M frequency divider 52' where M is a variable positive integer supplied from the programmable terminal P. In this case, $$N = L \cdot M$$

The control circuit 7' may be constructed by a microcomputer including a central processing unit (CPU), a read-only memory (ROM) for storing programs and constants, a random access memory (RAM) for storing temporary data, and the like.

The decoder 8' receives selection data SELD from the control circuit 7' to generate one selection signal SEL(0), SEL(1), SEL(2), . . . , or SEL(m−1) for selecting the switches 42'-0, 42'-1, 42'-2, . . . , or 42'-(m−1).

The bias voltage source 12 generates a bias voltage $V_B$ which is a predetermined value such as a center value of the control voltage $V_C$ as shown in FIG. 3. When the bias voltage $V_B$ is applied via the switch 11A to the loop filter 3, the control voltage $V_C$ is equal to the bias voltage $V_B$.

In a phase locked state the control circuit 7' generates no enable signal EN, i.e., EN="0", so that the switches 11A, 11B and 11C are activated toward their lower sides. As a result, a phase locked loop is formed by the phase/frequency comparator 1, the charge pump circuit 2, the loop filter 3, the voltage control oscillator block 4' and the 1/N frequency divider 5'.

Figure 6:
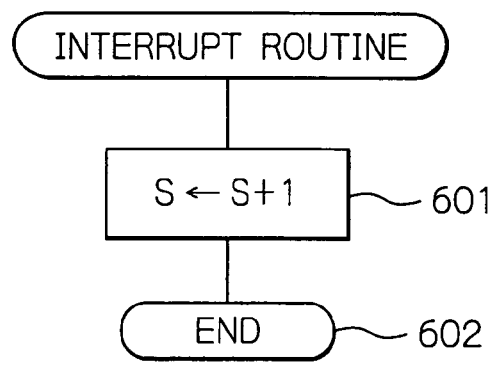
Figure 7:
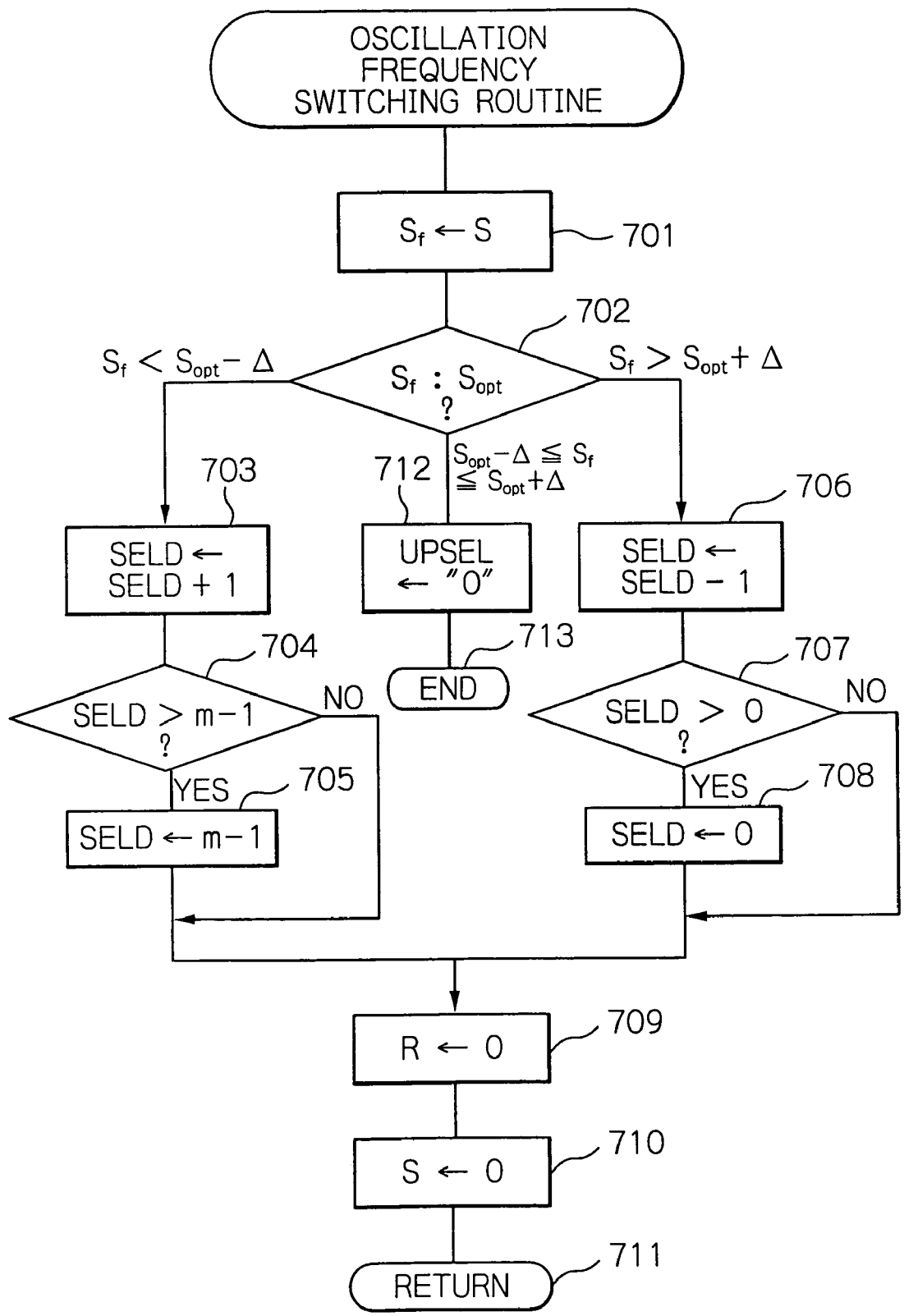

On the other hand, in a phase unlocked state or in an initial state where an optimum value $S_{opt}$ is set, an enable signal EN is supplied from an enable signal generating circuit (not shown) to the control circuit 7' which generates a frequency switching signal UPSEL, i.e., UPSEL="1", so that the switches 11A, 11B and 11C are activated at their upper sides. As a result, the input signal IN having the frequency $f_r$ is supplied to an interrupt terminal INT1 of the control circuit 7', and the output signal of the prescaler 51' having a frequency $f_{vco}/L$ is supplied to an interrupt terminal INT2 of the control circuit 7'. Thus, the switching operation of the oscillation frequency is carried out by the control circuit 7' using flowcharts as illustrated in FIGS. 5, 6 and 7.

Figure 5:
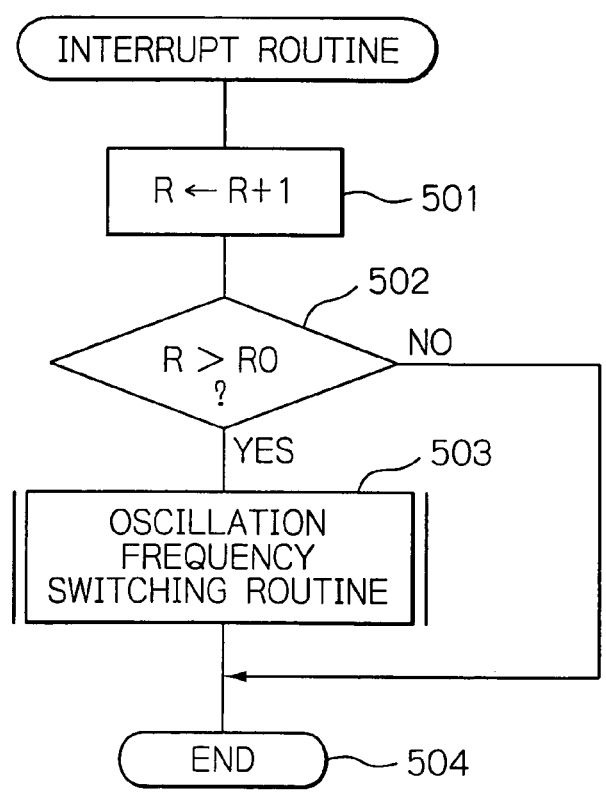
FIGS. 5, 6 and 7 are flowcharts for explaining the operation of the control circuit of FIG. 2.

The interrupt routine of FIG. 5 is carried out every time each pulse of the input signal IN is supplied to the interrupt terminal INT1 of the control circuit 7'.

Figure 8:
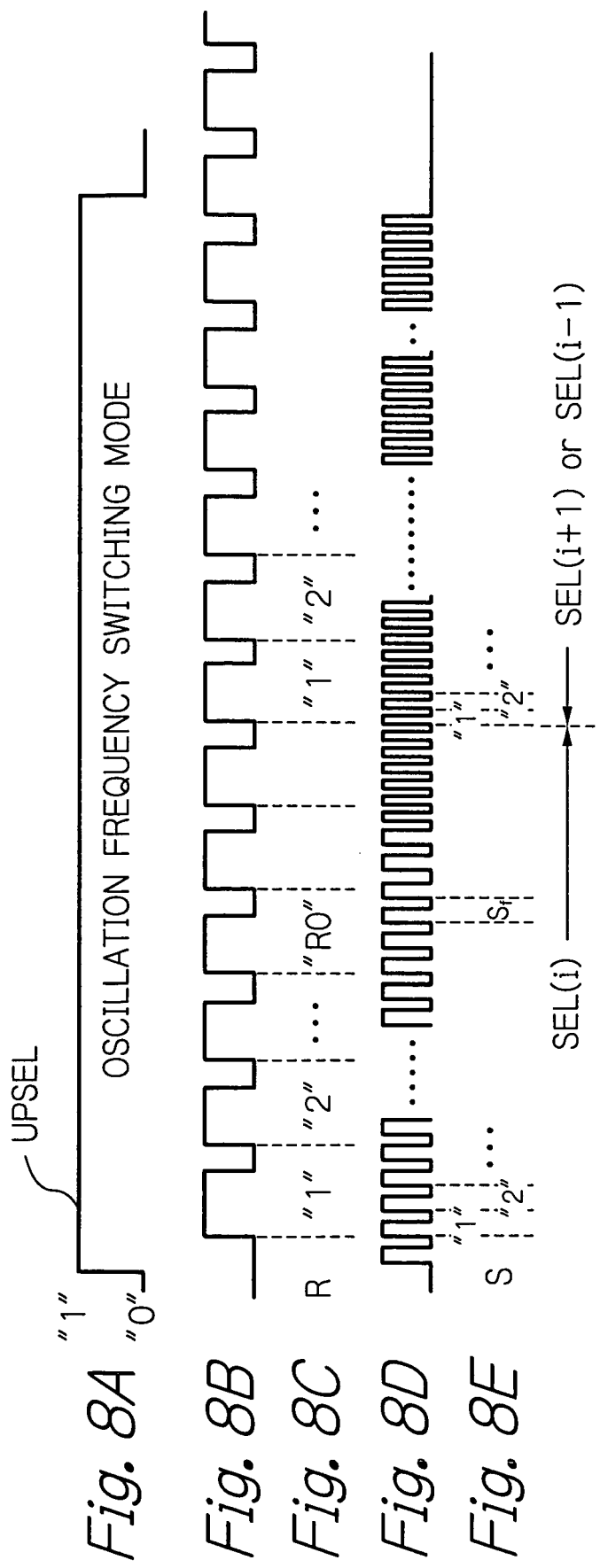
FIGS. 8A, 8B, 8C, 8D and 8E are timing diagrams for explaining the flowcharts of FIGS. 5, 6 and 7.

First, at step 501, a counter value R is counted up by +1. Note that, when the frequency switching signal UPSEL is changed as shown in FIG. 8A, the input signal IN($f_r$) at the interrupt terminal INT1 is as shown in FIG. 8B, and the counter value R is changed as shown in FIG. 8C.

Next, at step 502, it is determined whether or not the counter value R is larger than a predetermined value R0. As a result, only when R>R0, does the control proceed to an oscillation frequency switching step 503. Otherwise, the control proceeds directly to step 504. The oscillation frequency switching step 503 will be explained in detail later with reference to FIG. 7.

The interrupt routine of FIG. 6 is carried out every time each pulse of the output signal of the prescaler 51' is supplied to the interrupt terminal INT2 of the control circuit 7'.

First, at step 601, a counter value S is counted up by +1. Note that, when the frequency switching signal UPSEL is changed as shown in FIG. 8B, the output signal $f_{vco}/L$ of the prescaler 51' is as shown in FIG. 8D, and the counter value S is changed as shown in FIG. 8E.

Then, the routine of FIG. 6 is completed by step 602.

The oscillation frequency switching step 503 of FIG. 5 is explained next with reference to FIG. 7.

First, at step 701, the counter value S is defined as a final counter value $S_f$.

Next, at step 702, it is determined whether or not the final counter value $S_f$ is within an optimum range defined by $S_{opt}-\Delta$ and $S_{opt}+\Delta$, where $S_{opt}$ is the optimum value of the final counter value $S_f$ and $\Delta$ is a definite positive value. As a result, when $S_f<S_{opt}-\Delta$, the control proceeds to step 703, while, when $S_f>S_{opt}+\Delta$, the control proceeds to step 706. Also, when $S_{opt}-\Delta \leq S_f \leq S_{opt}+\Delta$, the control proceeds directly to step 712.

At step 703, the selection data SELD is increased by +1, i.e., SELD←SELD+1, so that the current selection signal SEL(i) is changed to a selection signal SEL(i+1). In this case, the selection data SELD is guarded by its maximum value m−1 using steps 704 and 705.

At step 706, the selection data SELD is decreased by 1, i.e., SELD←SELD−1, so that the current selection signal SEL(i) is changed to a selection signal SEL(i−1). In this case, the selection data SELD is guarded by its minimum value 0 using steps 707 and 708.

At steps 709 and 710, the counter values R and S are cleared to prepare for the next processing.

Then, the routine of FIG. 7 returns by step 711 to step 504 of FIG. 5.

On the other hand, at step 712, the control circuit 7' resets the frequency switching signal UPSEL, i.e., UPSEL="0".

Then, the routine of FIG. 7 is completed by step 713.

Thus, the operations as illustrated in FIGS. 5, 6 and 7 are repeated until the frequency switching signal UPSEL becomes "0", i.e., a phase locked state is established.

At steps 703 or 706 of FIG. 7, the selection data SELD is changed by 1; however, the selection data SELD can be changed by another value such as 2, 3, . . .

Figure 9:
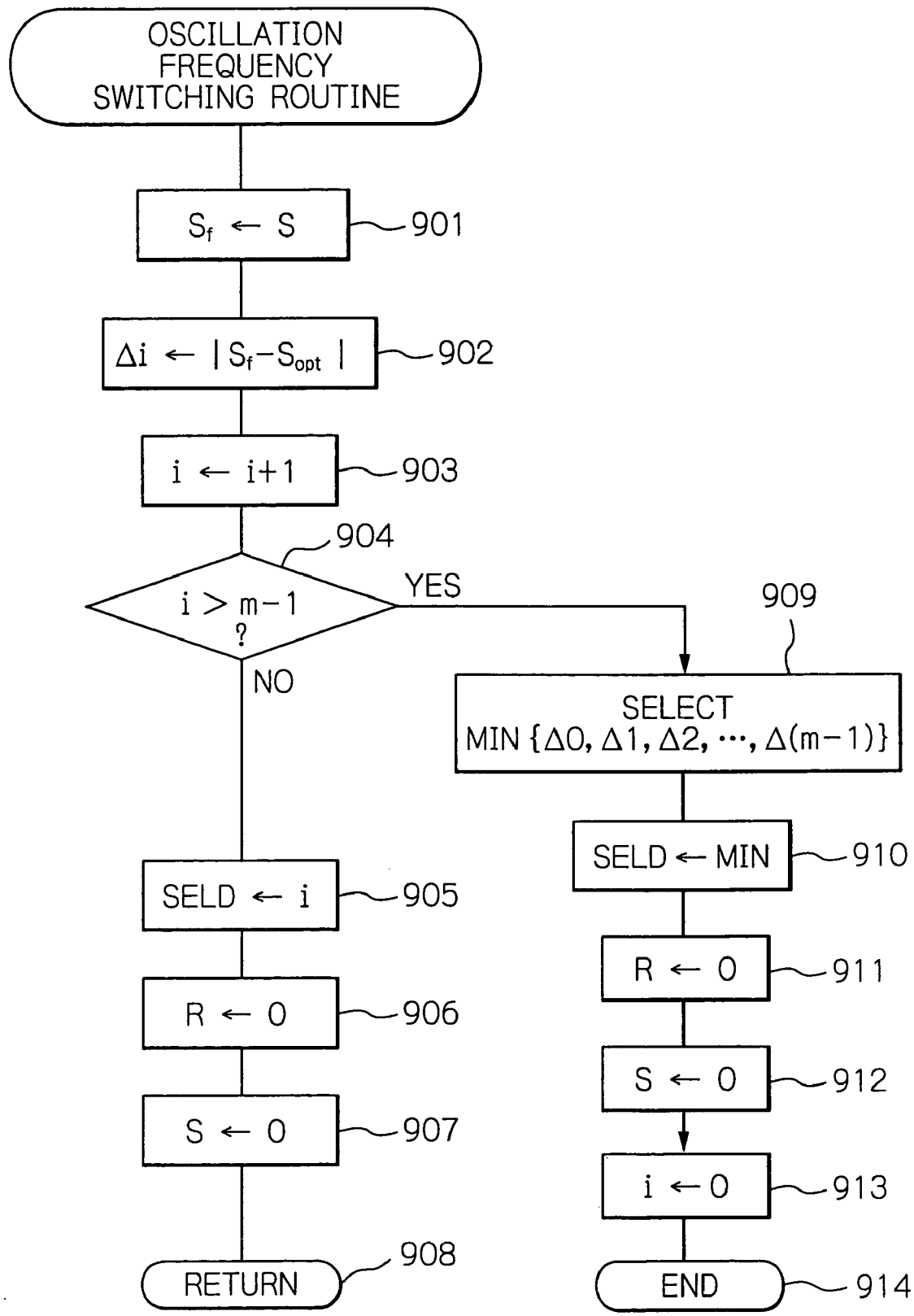
FIG. 9 is a flowchart illustrating a modification of the flowchart of FIG. 7.

A modification of the oscillation frequency switching routine of FIG. 7 is illustrated in FIG. 9. In FIG. 9, the value i is initialized at 0 by an initialization routine (not shown).

First, at step 901, the counter value S is defined as a final counter value $S_f$.

Next, at step 902, an absolute value $\Delta i$ is calculated by $$\Delta i \leftarrow |S_f - S_{opt}|$$

where $S_{opt}$ is an optimum value of the final counter value $S_f$.

Next, at step 903, the value i is counted up by +1, i.e., $$i \leftarrow i+1$$

Next, at step 904, it is determined whether or not the value i is beyond its maximum, i.e., whether or not i>m−1 is satisfied. As a result, when i≦m−1, the control proceeds to step 905, while, when i>m−1, the control proceeds to step 909.

At step 905, the selection data SELD is caused to be i, and at steps 906 and 907, the counter values R and S are cleared, thus preparing for the next processing.

Then, the routine of FIG. 9 returns by step 908 to step 504 of FIG. 5.

On the other hand, at step 909, a minimum value MIN is selected from the absolute value $\Delta 0, \Delta 1, \Delta 2, \ldots, \Delta(m-1)$, and at step 910, the selection data SELD is caused to be MIN. As a result, the decoder 8' generates a selection signal SEL(MIN), so that the switch 42'-MIN is turned ON and the other switches are turned OFF.

Next, at step 911, 912, and 913, the counter values R and S and the value i are cleared, thus preparing for the next processing.

Then, the routine of FIG. 9 is completed by step 914.

Thus, the operations as illustrated in FIGS. 5, 6 and 9 are also repeated until the frequency switching signal UPSEL becomes "0".

In the above-described embodiment, as illustrated in FIG. 3, since the carrier power to noise power (C/N) characteristics of each of the voltage controlled oscillators 41'-1, 41'-1, 41'-2, . . . , 41'-(m−1) depends upon the modulation sensitivity $K_V$, an optimum modulation sensitivity $K_V$ can be determined by selecting an optimum one of the voltage controlled oscillators. Thus, a lock range of the voltage controlled oscillator block 4' can be widened without the C/N characteristics.

As explained hereinabove, according to the present invention, since the up/down counter of the prior art is unnecessary, even when the precision of the phase/frequency comparator is enhanced, the switching from a phase unlocked state to a phase locked state is not delayed to decrease the lockup time. Also, since only one voltage controlled oscillator is activated, the power consumption can be decreased.

The invention claimed is:

1. A phase locked loop type frequency synthesizer comprising:
    a phase/frequency comparator for receiving an input signal;
    a charge pump circuit connected to said phase/frequency comparator;
    a bias voltage source for generating a bias voltage;
    a loop filter, selectively connected to one of said charge pump circuit and said bias voltage, for generating a control voltage, said charge pump circuit charging and discharging said loop filter in accordance with an output signal of said phase/frequency comparator, said bias voltage source applying said bias voltage to said loop filter;
    a voltage control oscillator block connected to said loop filter and including a plurality of voltage controlled oscillators controlled by said control voltage;
    a first frequency divider connected to said voltage controlled oscillator block;
    a second frequency divider connected to said first frequency divider, said phase/frequency comparator comparing a phase of said input signal with a phase of an output signal of said second frequency divider; and
    a selecting circuit, connected to said first frequency divider and said voltage controlled oscillator block, for selecting and activating only one of said voltage controlled oscillators;
    said selecting circuit counting a number of output pulses of said first frequency divider within a predetermined number of output pulses of said input signal while applying said bias voltage to said loop filter, the one of said voltage controlled oscillators being selected so that the number of the output pulses of said first frequency divider is brought close to an optimum value.

2. The phase locked loop type frequency synthesizer as set forth in claim 1, wherein said voltage control oscillator block comprises:
    a fixed inductor;
    a variable capacitor connected in parallel to said fixed inductor and controlled by said control voltage;
    a plurality of fixed capacitors connected in parallel to said fixed inductor and selected by said selecting circuit; and
    a fixed resistor connected in parallel to said fixed inductor,
    each of said voltage control oscillators including said fixed inductor, said variable capacitor, one of said fixed capacitor and said fixed resistor.

3. The phase locked loop type frequency synthesizer as set forth in claim 1, wherein said voltage control oscillator block comprises:
    a plurality of voltage controlled oscillator units controlled by said control voltage; and
    a plurality of reference current sources each connected to one of said voltage controlled oscillator units,
    each of said voltage controlled oscillators including one of said voltage controlled oscillator units and its corresponding reference current source,
    only one of said reference current sources being turned ON by said selecting circuit.

4. The phase locked loop type frequency synthesizer as set forth in claim 1, further comprising:
    a first switch, connected to said charge pump circuit, said bias voltage source, said loop filter and said control circuit;
    a second switch circuit connected to said selecting circuit; and
    a third switch, connected between said first frequency divider and said selecting circuit,
    wherein, when said control circuit operates said first switch so that said bias voltage source is connected to said loop filter, said selecting circuit turns ON said second and third switches.

5. The phase locked loop type frequency synthesizer as set forth in claim 1, wherein a division ratio of said first frequency divider is fixed and a division ratio of said second frequency divider is programmable.

6. The phase locked loop type frequency synthesizer as set forth in claim 1, wherein said selecting circuit carries out the following operations of:
    selecting one of said voltage controlled oscillators while applying said bias voltage to said loop filter;
    determining whether or not the number of output pulses of said first frequency divider is within a predetermined range including said optimum value, where the one of said voltage controlled oscillators is selected;
    selecting another of said voltage controlled oscillators while applying said bias voltage to said loop filter, when the number of output pulses of said first frequency divider is deviated from said predetermined range; and
    fixing selection of the one of said voltage controlled oscillators while connecting said charge pump circuit to said loop filter when the number of output pulses of said first frequency divider is within said predetermined range.

7. The phase locked loop type frequency synthesizer as set forth in claim 1, wherein said selecting circuit carries out the following operations of:
    selecting one of said voltage controlled oscillators while applying said bias voltage to said loop filter;
    calculating an absolute value of a difference between the number of output pulses of said first frequency divider and said optimum value;
    repeating said selecting and calculating operations for all of said voltage controlled oscillators to obtain minimum values therefor;
    selecting a minimum value of said absolute values; and
    fixing selection of one of said voltage controlled oscillators corresponding to said minimum value while connecting said charge pump circuit to said loop filter.

8. A method for selecting an oscillation frequency in a phase locked loop type frequency synthesizer including:
    a phase/frequency comparator for receiving an input signal;
    a charge pump circuit connected to said phase/frequency comparator;
    a bias voltage source for generating a bias voltage;
    a loop filter selectively connected to one of said charge pump circuit and said bias voltage, for generating a control voltage;

a voltage control oscillator block connected to said loop filter and including a plurality of voltage controlled oscillators controlled by said control voltage;

a first frequency divider connected to said voltage controlled oscillator block; and a second frequency divider connected to said first frequency divider, said phase/frequency comparator comparing a phase of said input signal with a phase of an output signal of said second frequency divider, said method comprising:

counting a number of output pulses of said first frequency divider within a predetermined number of output pulses of said input signal while applying said bias voltage to said loop filter; and selecting one of said voltage controlled oscillators so that the number of the output pulses of said first frequency divider is brought close to an optimum value.

9. The method as set forth in claim 8, wherein said selecting comprises:

selecting one of said voltage controlled oscillators while applying said bias voltage to said loop filter;

determining whether or not the number of output pulses of said first frequency divider is within a predetermined range including said optimum value, where the one of said voltage controlled oscillators is selected;

selecting another of said voltage controlled oscillators while applying said bias voltage to said loop filter, when the number of output pulses of said first frequency divider is deviated from said predetermined range; and fixing selection of the one of said voltage controlled oscillators while connecting said charge pump circuit to said loop filter when the number of output pulses of said first frequency divider is within said predetermined range.

10. The method as set forth in claim 8, wherein said selecting comprises:

selecting one of said voltage controlled oscillators while applying said bias voltage to said loop filter;

calculating an absolute value of a difference between the number of output pulses of said first frequency divider and said optimum value;

repeating said selecting and calculating operations for all of said voltage controlled oscillators to obtain minimum values therefor;

selecting a minimum value of said absolute values; and fixing selection of one of said voltage controlled oscillators corresponding to said minimum value while connecting said charge pump circuit to said loop filter.

* * * * *